United States Patent [19]

Sugahara

[11] Patent Number: 5,401,683
[45] Date of Patent: * Mar. 28, 1995

[54] METHOD OF MANUFACTURING A MULTI-LAYERED SEMICONDUCTOR SUBSTRATE

[75] Inventor: Kazuyuki Sugahara, Hyogo, Japan

[73] Assignee: Agency of Industrial Science and Technology, Tokyo, Japan

[*] Notice: The portion of the term of this patent subsequent to Dec. 28, 2008 has been disclaimed.

[21] Appl. No.: 243,706

[22] Filed: Sep. 13, 1988

[30] Foreign Application Priority Data

Dec. 4, 1987 [JP] Japan .................. 62-305890

[51] Int. Cl.⁶ .......................... H01L 21/20
[52] U.S. Cl. .................. 437/90; 437/173; 437/174; 437/19; 437/973
[58] Field of Search .......... 437/173, 174, 973, 19, 437/90

[56] References Cited

U.S. PATENT DOCUMENTS 4,523,962 6/1985 Nishimura .

FOREIGN PATENT DOCUMENTS

| | | | |
|---|---|---|---|
| 57-045920 | 3/1982 | Japan | 437/174 |
| 57-049226 | 3/1982 | Japan | 437/174 |
| 58-114422 | 7/1983 | Japan | 437/174 |
| 58-180019 | 10/1983 | Japan | 437/174 |
| 63-003447 | 1/1988 | Japan | 437/19 |

OTHER PUBLICATIONS

Horita et al., "Improvement of Membrane Quality of Recrystallized SOI Membrane by Electric Beams with Perforation Seed Structure", The 33rd Applied Physics Relating Associated Lecture Meeting, Spring 1986, p. 532, translation—pp. 1–3.

*Primary Examiner*—Brian E. Hearn
*Assistant Examiner*—Trung Dang
*Attorney, Agent, or Firm*—Rothwell, Figg, Ernst & Kurz

[57] ABSTRACT

A method of manufacturing a multi-layered semiconductor substrate comprising:

a step of forming a first insulation film on the main surface of a semiconductor substrate composed of single crystals, a step of forming a first linear opening of a predetermined size reaching the semiconductor substrate at a predetermined position of the first insulation film, a step of forming second opening with the opening area of 25 μm² or less and reaching the semiconductor substrate along the first opening to the first insulation film at a position a spaced apart at least by 10 μm from the outer edge of the first opening, a step of forming a semiconductor layer composed of non-single crystals on the first insulation film also including the inside of the first and the second openings, a step of forming a second insulation film on the semiconductor layer, a step of supplying heat energy to the semiconductor layer by scanning in the direction from the first opening toward the second opening, and melting the semiconductor layer with the heat energy thereby single-crystallizing the semiconductor layer, and a step of removing the second insulation film.

9 Claims, 5 Drawing Sheets

FIG. 7
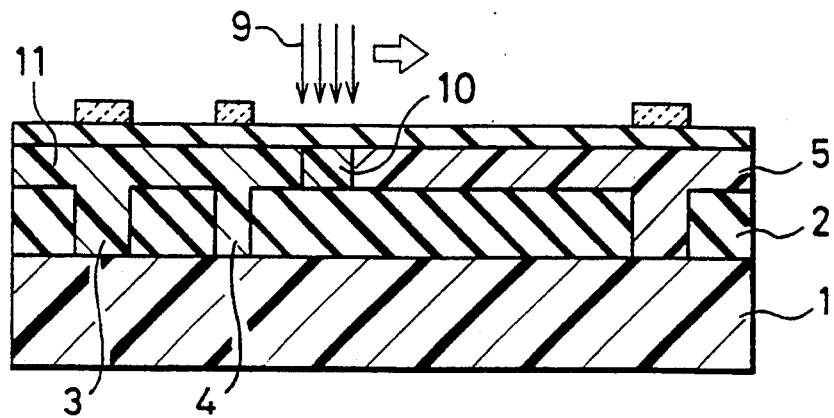
FIG. 7 (E)
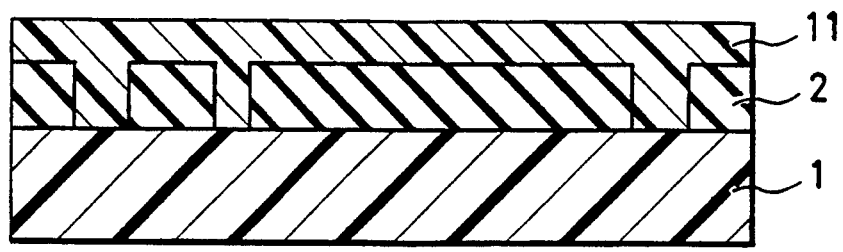
FIG. 7 (F)
FIG. 8
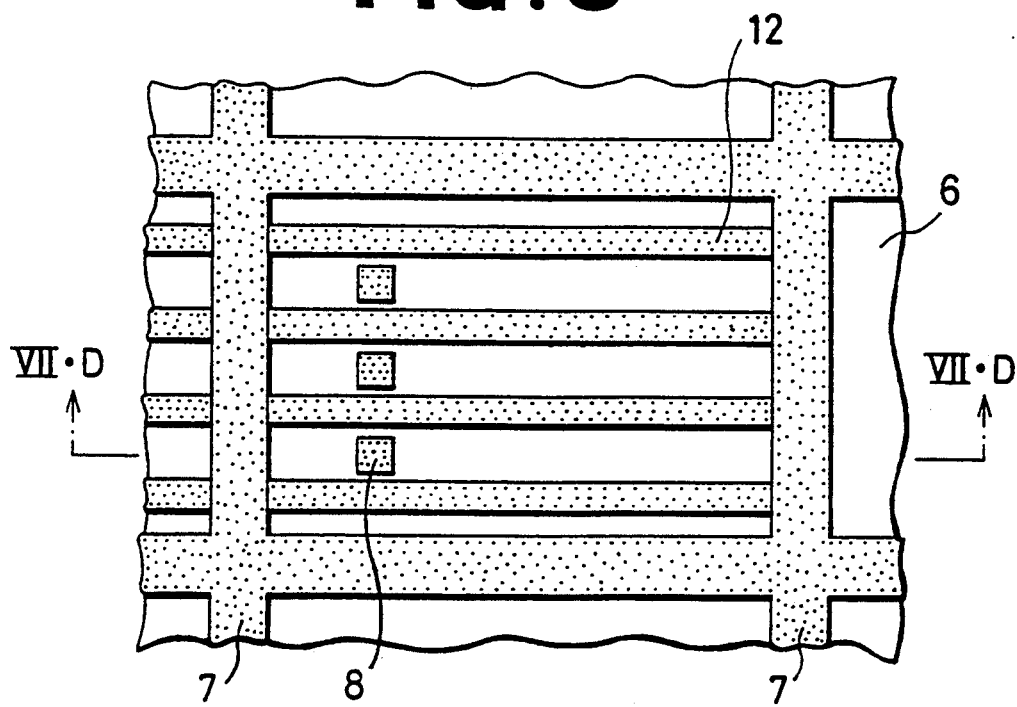

METHOD OF MANUFACTURING A MULTI-LAYERED SEMICONDUCTOR SUBSTRATE

BACKGROUND OF THE INVENTION

1. Field of the Invention

The present invention concerns a method of manufacturing a semiconductor substrate and, more particularly, it relates to a method of manufacturing a multi-layered semiconductor substrate for forming circuit elements such as transistors on a single crystal semiconductor substrate formed on an insulation material.

2. Description of the Prior Art

There has been made an attempt of manufacturing semiconductor integrated circuits with less stray capacity by isolating circuit elements with dielectric material for improving the performance of semiconductor devices and an attempt of manufacturing so-called three dimensional circuit devices in which circuit elements are laminated in a three dimensional manner. As one of such methods, there has been known a method of forming a non-single crystal semiconductor layer on an insulation layer, and heating only the surface layer thereof by the irradiation of energy rays such as laser beams, thereby forming a single crystal semiconductor layer. In this case, there has been attempted to partially dispose an opening, that reaches a semiconductor single crystal substrate, to the insulation material and to prevail the melting at the non-single crystal semi-conductor layer to the surface of the single crystal semiconductor substrate at the opening, thereby making the non-single crystal semiconductor layer into single crystals having the identical axis of crystallization with that of the single crystals in the substrate.

FIG. 1 is a plan view for the conventional semiconductor substrate just before the irradiation of energy-rays and FIG. 2 is a cross sectional view taken along line II—II in FIG. 1.

Explanation is to be made for the constitution while referring to both of the figures. At first, an oxide film 2 as a first insulation film comprising silicon dioxide is formed to a thickness of 1 μm on a silicon substrate 1, which is a semiconductor substrate comprising single crystals and having a main surface, and openings 3 reaching the silicon substrate 1 are disposed at predetermined positions. Then, polycrystalline silicon 5 is deposited to a thickness of 0.5 μm on the oxide film 2 also including the inside of the openings 3 by way of a chemical gas phase growing method (CVD method) and, an oxide film 6 as a second insulation film is deposited further thereover to a thickness of 100 Å also by way of the CVD method. Further, a nitride film 7 is deposited in a stripe-like manner to a thickness of 500 Å over the oxide film 6 at the positions above the openings 3 by means of the CVD method. Furthermore, a nitride film 12 each of 5 μm width is formed at 10 μm distance to a thickness of 500 Å on the oxide film 6 put between the nitride films 7 also by means of the CVD method. The opening 3 is usually referred to as a scribe line having 100–200 μm width and 10–20 mm length, which is disposed as a region for isolating the chips of a semiconductor integrated circuit.

FIG. 3 is a cross sectional view of a semiconductor substrate during irradiation of the energy-rays.

The irradiation state is to be explained referring to the drawing. Continuously oscillating argon laser beams 9 restricted to 100 μm diameter are irradiated to the semiconductor substrate of the structure as shown in FIG. 3 under scanning at a scanning rate of 25 cm/s to melt the polycrystalline silicon 5. Solidification and recrystallization of the melted molten silicon 10 occurs from the single crystal silicon substrate 1 at the opening 3 toward the polycrystalline silicon 5 on the oxide film 2, and the polycrystalline silicon 5 on the oxide film 2 is formed into a single crystalline silicon 11 having the same axis of crystallization with that of the single crystal silicon of the substrate 1 after ending the laser beam irradiation. In this case, the nitride film 7 over the opening 3 functions as the reflection preventive film for the laser beams upon irradiation thereof and it is disposed for preventing the lowering of the polycrystalline silicon temperature in the opening 3 showing greater heat diffusion than the oxide film 2. Further, the nitride film 12 disposed in the stripe-like manner on the polycrystalline silicon 5 on the oxide film 2 is disposed for controlling the lateral temperature distribution in the polycrystalline silicon 5 upon laser beam irradiation, so that the growth of the single crystals occurs continuously over the entire chip. The mechanism for the recrystallization is specifically described in Japanese Patent Application No. Sho 61-48468. Further, the oxide film 6 is disposed so that nitrogen in the nitride films 7 and 12 may not intrude into the molten silicon 10 melted upon laser beam irradiation. After the laser beam irradiation is completed and the polycrystalline silicon 5 in the chip is formed into single crystals, the nitride films 7, 12 and the oxide film 6 are removed and, subsequently, circuit elements are formed on the single-crystallized silicon 11 on the oxide film 2 by the usual production process for the integrated circuit. After all of the processes as described above have been completed, the semiconductor substrate is scribed along the openings 3 to complete individual semiconductor integrated circuit chips each of 10–20 mm square. Accordingly, the opening 3 has a function of producing a single-crystallized silicon film 11 having the same axis of crystallization as that of the single crystal silicon substrate 11 on the oxide film 2 and a function of the scribe line for scribing the semiconductor circuit chips after the completion of all of the processes.

In the conventional production process as described above, the opening 3 is formed linearly over a large region. Accordingly, since the temperature distribution upon melting of the polycrystalline silicon 5 in the opening 3 and the polycrystalline silicon 5 on the oxide film 2 are different (the temperature of polycrystalline silicon 5 on the oxide film 2 is higher), the viscosity of the molten silicon 10 situated on the oxide film 2 is lower. Therefore, the film thickness of the polycrystalline silicon 5 on the oxide film 2 adjacent with the end of the opening 3 is decreased upon recrystallization (single crystallization) by the surface tension exerted to the boundary between the oxide films 2 and 6.

FIG. 4 is a cross sectional view for the semiconductor substrate illustrating such a state.

As shown in the drawing, the polycrystalline silicon 5 on the oxide film 2 at the end of the opening 3 is recessed as a pit portion 15 and the polycrystalline silicon 5 on the oxide film 2 at the end of the opening 3 in the downward side of the scanning is bulged by so much as the recess to form a protrusion 16. The recess may sometimes increase further and the single-crystallized silicon 11 at the end of the opening 3 is eliminated by the movement of the molten silicon 10 upon melting (the film thickness is reduced to 0). It is apparent that this problem can be overcome if the temperature of the polycrystalline silicon 5 upon melting could be made uniform at the opening 3 and on the oxide film 2. However, it has been actually difficult, in view of the cost, to make the temperature uniform in various structures. It has been further attempted to make the temperature uniform by reducing the size of the opening 3 for overcoming the problem.

FIG. 5 is a plan view illustrating this embodiment and FIG. 6 is a cross sectional view taken along line VI—VI in FIG. 5.

Referring to both of the drawings, the opening is not formed in the region of the scribe line 17 but square form openings 18 each of 5 μm on a side are disposed at 15 μm intervals near the scribe line 17. By reducing the size of the openings and disposing them in a scattered manner, since the non-uniformity of the temperature upon melting the polycrystalline silicon 5 is limited to the size-reduced openings 18, the non-uniformity for the film thickness of the polycrystalline silicon 5 after recrystallization is reduced and the problem in the production of the circuit elements can be avoided. However, since it is actually necessary to dispose linear openings such as alignment marks for the mask alignment in the subsequent step, it brings about various practical problems in reducing the size for all of the openings and disposing them in a scattered manner.

SUMMARY OF THE INVENTION

The present invention has been accomplished for overcoming the foregoing problems and it is an object thereof to provide a method of manufacturing a multi-layered semiconductor substrate capable of obtaining a semiconductor layer comprising single crystals having the identical axis of crystallization with that of the substrate and with less change in the film thickness even if linear openings are formed to the insulation material.

For attaining the above-mentioned purpose, in the method of manufacturing a multi-layered semiconductor substrate according to the present invention, an opening with a surface area of 25 μm² or less is disposed to an insulation film at the downstream in the direction of the heat energy scanning with at least 10 μm distance from a linear opening.

Accordingly, in the present invention, the opening with the surface area of 25 μm² or less disposed near the linear opening can suppress the change of the film thickness of the polycrystalline silicon after recrystallization.

BRIEF DESCRIPTION OF THE DRAWINGS

FIG. 1 through FIG. 6 show conventional embodiments, in which

FIG. 1 is a plan view of a semiconductor substrate before the irradiation of energy-rays;

FIG. 2 is a cross sectional view taken along line II—II of FIG. 1;

FIG. 3 is a cross sectional view of a semiconductor substrate during irradiation of energy-rays;

FIG. 4 is a cross sectional view of a semiconductor substrate illustrating the state of the semiconductor layer after the irradiation of energy-rays;

FIG. 5 is a plan view illustrating another conventional embodiment; and

FIG. 6 is a cross sectional view taken along VI—VI of FIG. 5;

FIG. 8 is a plan view corresponding to FIG. 7(D), FIG. 7(D) corresponding to a cross sectional view taken along line VIID—VIID of FIG. 8;

DETAILED DESCRIPTION OF THE PREFERRED EMBODIMENTS

Figure 1:
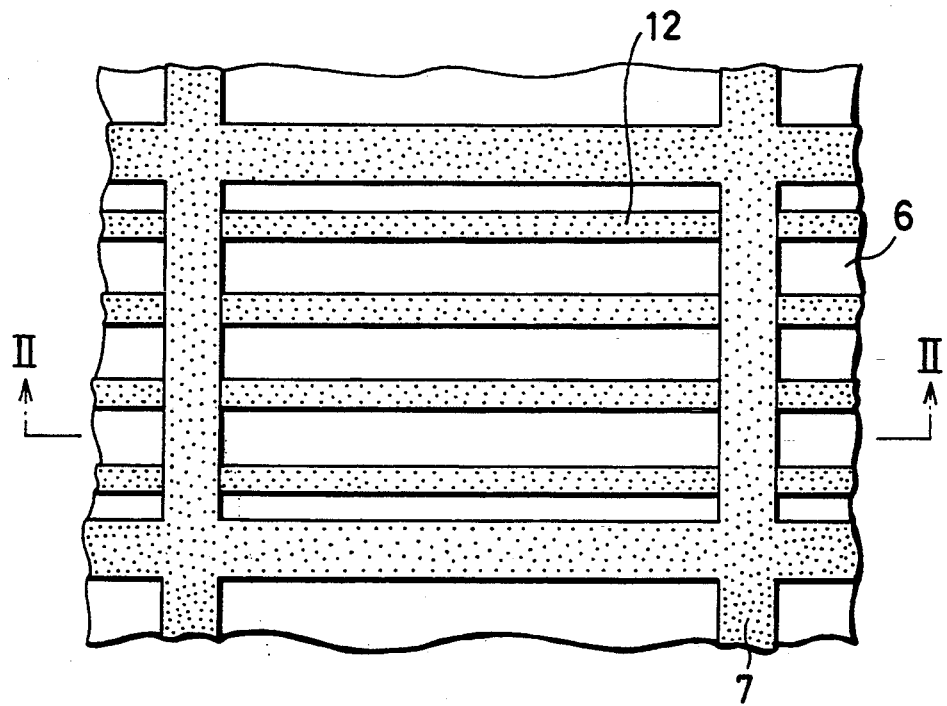
Figure 2:
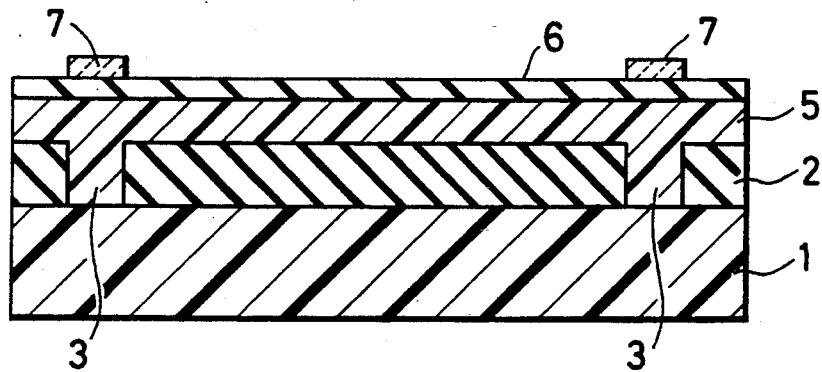
Figure 3:
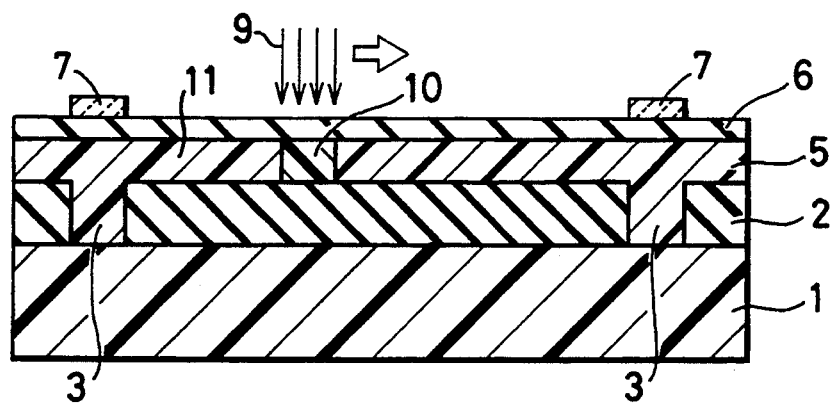
Figure 4:
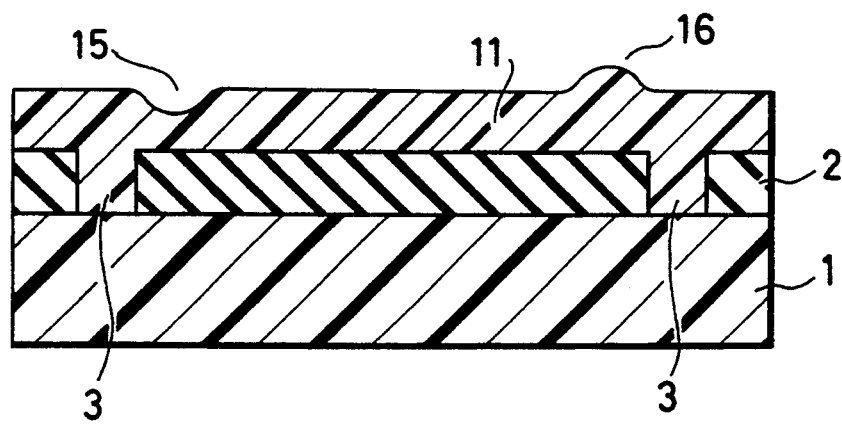
Figure 5:
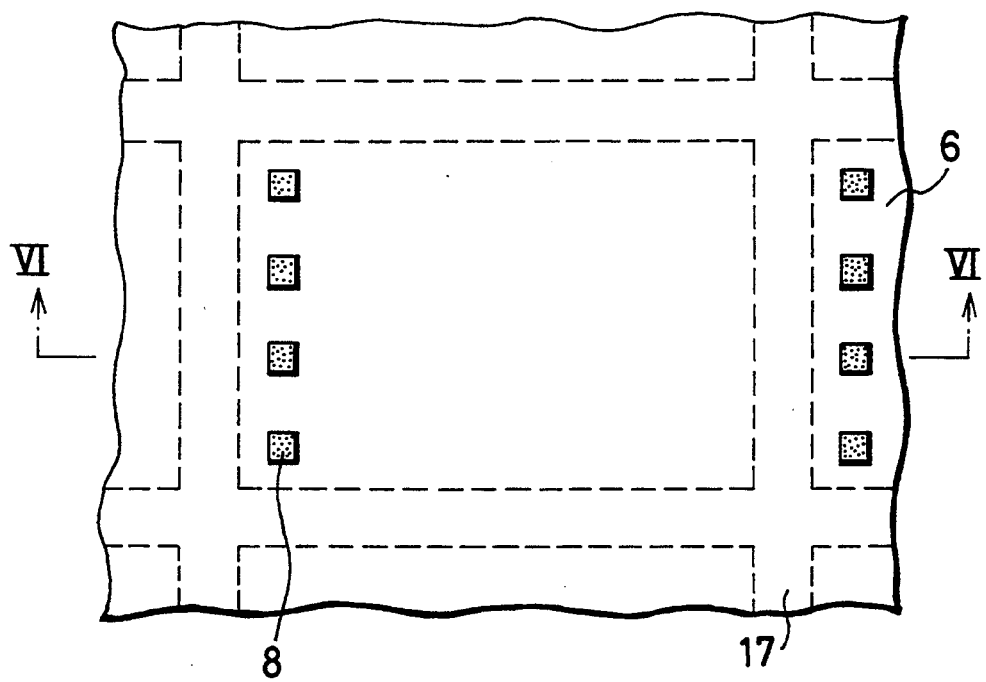
Figure 6:
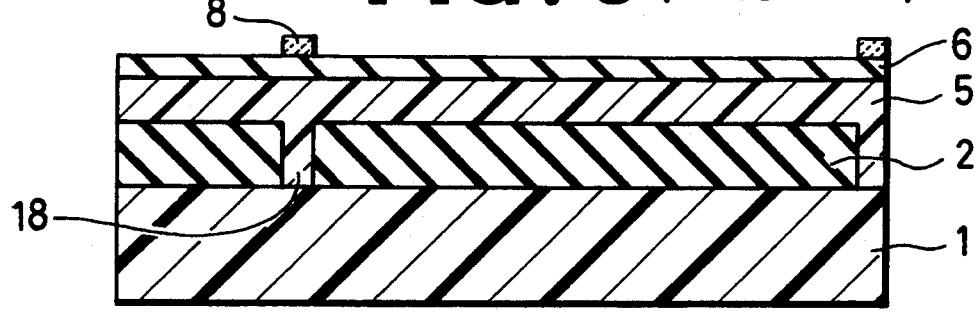

Explanation is to be made for various embodiments according to the present invention while referring to the drawings.

Figure 7:
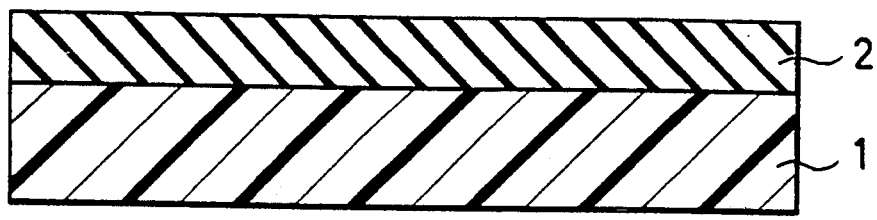
FIGS. 7(A)–(F) are cross sectional schematic step views illustrating the manufacturing method in one embodiment of the present invention.
Figure 7:
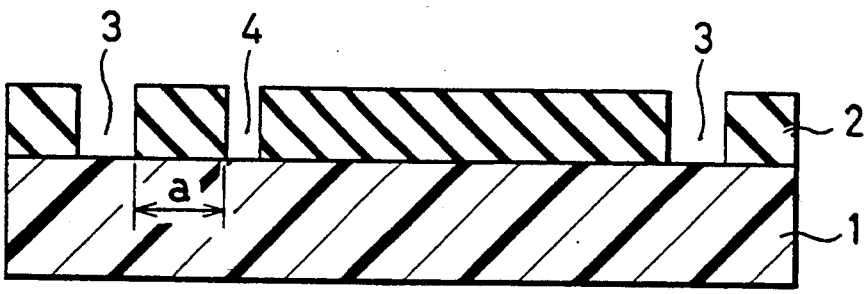
Figure 7:
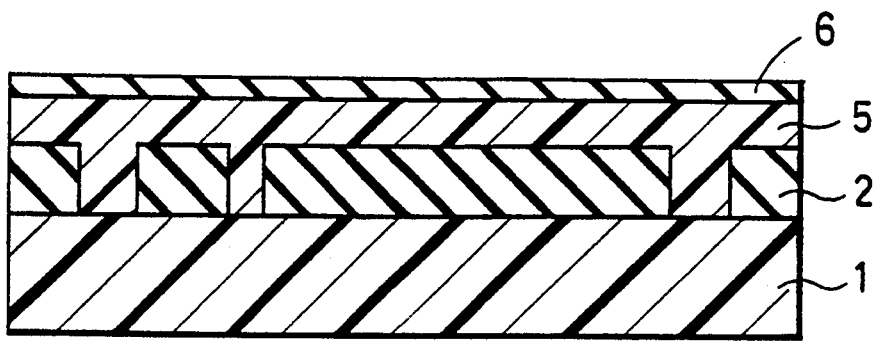
Figure 7:
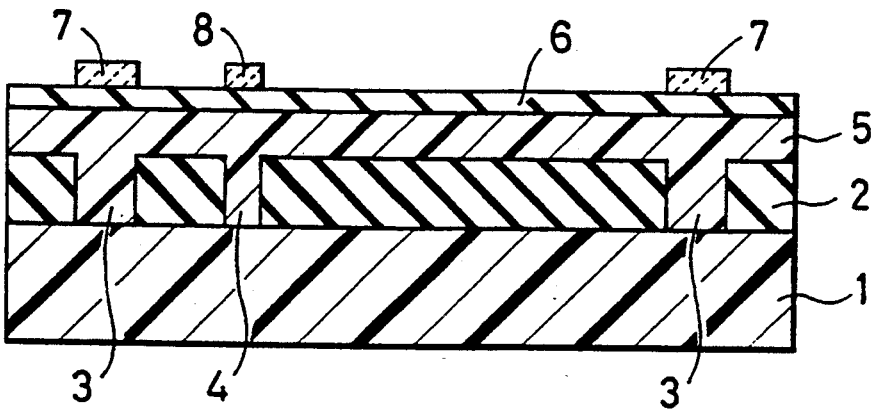

FIGS. 7(A)–(F) are schematic cross sectional step views illustrating the manufacturing method in one embodiment according to the present invention and FIG. 8 is a plan view for a semiconductor substrate corresponding to FIG. 7(D) before the irradiation of energy-rays.

The manufacturing method is to be explained while referring to the drawings.

At first, an oxide film 2 comprising silicon oxide as a first insulation film of 1 μm thickness is formed on a silicon substrate 1, which is a semiconductor substrate comprising single crystals and having a main surface [refer to FIG. 7(A)] and then a first opening 3 and a second opening 4 reaching a silicon substrate 1 are formed by patterning the oxide film 2. In this case, the opening 3 is used as a scribe line (100–200 μm width, 10–20 mm length), while each of the openings 4 has a square opening cross section with 5 μm side and they are disposed in a scattered manner at 15 μm intervals along the opening 3 with the distance a of 50 μm from the opening 3 [refer to FIG. 7(B)].

Then, polycrystalline silicon 5, which is a non-single crystal semiconductor layer, is deposited to a thickness of 0.5 μm on the oxide film 2 also including the inside of the openings 3 and 4 by way of a CVD method and, an oxide film 6 comprising silicon dioxide is deposited as the second insulation film further thereover to a thickness of 100 Å also by the CVD method [refer to FIG. 7(C)].

Successively, a nitride film is deposited on the oxide film 6 by the CVD method and then patterned to thereby form stripe-like rectangular nitride films 7 and 8 as a first nitride film to a thickness of 500 Å above the openings 3 and 4 at the corresponding positions respectively [refer to FIG. 7(D)].

FIG. 8 shows the plan view in the state of FIG. 7(D) [FIG. 7(D) is a cross sectional view taken along line VIID—VIID of FIG. 8]. As shown in FIG. 8, stripe-like nitride films 12 as a second nitride film are further disposed at a predetermined interval to the region on the oxide film 6 surrounded with the nitride films 7. The nitride film 12 functions to control the temperature distribution of the polycrystalline silicon 5 in the lateral direction (laser scanning direction) upon irradiation of laser beams, so that the growing of the single crystals continues to the entire chip in the same manner as the conventional embodiment. Furthermore, nitride films 8 corresponding to the openings 4 are formed in the scattered manner at the positions put between the nitride films 12.

Argon laser beams 9 of 100 μm beam diameter are irradiated from above the semiconductor substrate of such a structure while scanning rightwardly along the direction VIID—VIID in FIG. 8, that is, in the direction from the opening 3 to the opening 4. Then, the polycrystalline silicon 5 is melted from the opening 3 on the left into molten silicon 10 and the solidification and recrystallization proceed in the rightward direction in the drawing. In this case, since the temperature of the polycrystalline silicon 5 on the oxide film 2 at a portion in contact with the opening 3 becomes higher than the temperature of the polycrystalline silicon 5 at the opening 4, the film thickness of the single-crystallized silicon 11 after the recrystallization of the polycrystalline silicon 5 in the region between the opening 3 and the opening 4 is decreased. However, since the region in which the temperature is not uniform upon melting of the polycrystalline silicon 5 with the opening 4 is only a small region extending to the right of the opening 4, there is no decrease in the film thickness of the single-crystallized silicon 11 after the recrystallization of the polycrystalline silicon [FIG. 7(E)]. By forming the opening 4 thus at an appropriate position, it is possible to confine the decrease of the film thickness of the single-crystallized silicon 11 only to a region between the linear opening 3 and the opening 4 of a square cross section. It is desired that such a region is smaller in view of the degree of integration. However, if the opening 3 and the opening 4 are brought closer with a gap of less than 10 μm, since the molten silicon 10 has a size about 100 μm in diameter (since the laser beam diameter is 100 μm), the temperature of the polycrystalline silicon 5 on the oxide film 2 between the opening 3 and the opening 4 does not elevate due to the presence of adjacent openings 3 and 4 and the thickness of the single-crystallized silicon 11 is not decreased in this portion. However, since the temperature of the polycrystalline silicon 5 between the opening 3 and the opening 4 is lowered entirely, while the temperature of the polycrystalline silicon 5 at the right of the opening 4 is increased, non-uniformity of the temperature on both ends of the opening 4 prevails over a wide range and the decrease of the film thickness in the single-crystallized silicon 11 after recrystallization is inevitable. Accordingly, it is necessary that the small opening 4 with the surface area of 25 μm² or less is separated by more than about 10 μm from the linear opening 3.

Figure 9:
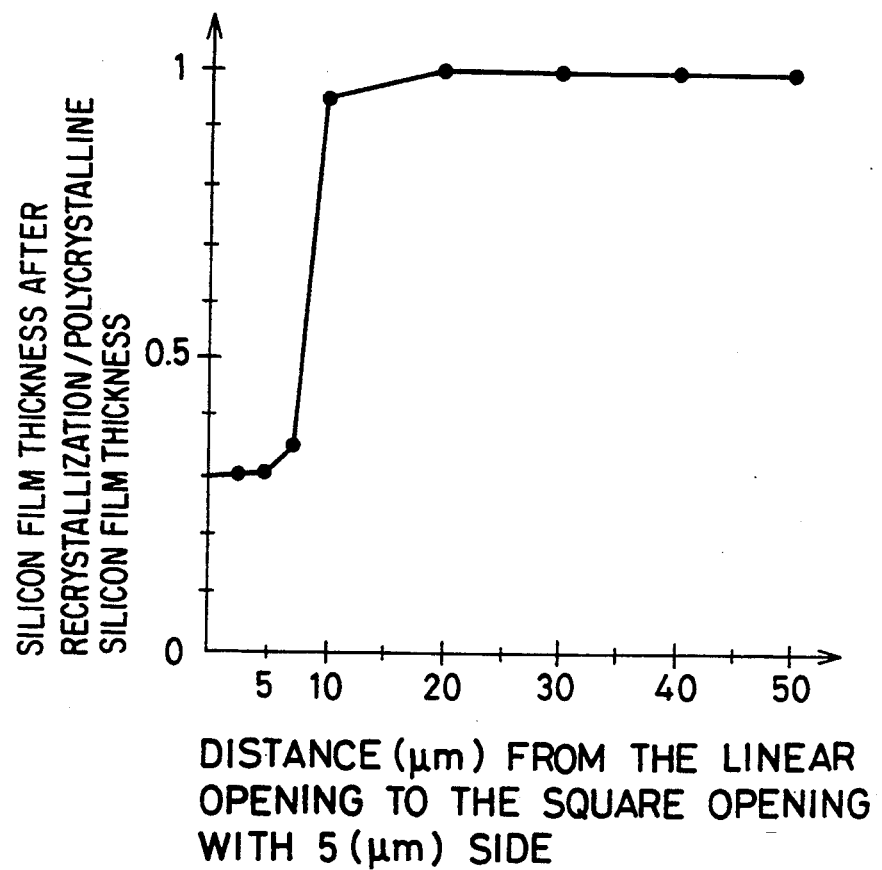
FIG. 9 is a graph showing the relationship between the distance from the linear opening and the square opening of 5 μm side, and the ratio of the silicon film thickness before and after the recrystallization.

FIG. 9 is a graph showing the result of an experiment for the relationship of the distance from the linear opening (opening 3) and the square opening with 5 μm side (opening 4), relative to the ratio of the silicon film thickness after the recrystallization and the polycrystalline silicon film thickness before melting.

In the drawing, the distance (μm) from the linear opening to the square opening with 5 μm side is taken on the abscissa, whereas the ratio between the silicon film thickness after the recrystallization and the polycrystalline silicon film thickness before the melting is taken on the ordinate.

As shown in the figure, it can be seen that if the distance between the linear opening (opening 3) and the square opening (opening 4) is less than 10 μm, the film thickness ratio is extremely decreased, that is, the film thickness of the single-crystallized silicon is extremely reduced. Accordingly, it is important that the distance [dimension a in FIG. 7(B)] has to be kept at least to 10 μm.

After the irradiation of the laser beams 9 has been completed, the nitride films 7, 8 and 12 and the oxide film 6 are removed, and circuit elements can be formed on the single-crystallized silicon 11 by means of usual production process for integrated circuits [FIG. 7(F)].

Although in the foregoing embodiment, square openings each of 5 μm side (opening 4) are disposed only to the right of the linear opening (opening 3) (downstream in the laser beam scanning direction), they may be disposed over the entire periphery of the linear opening.

Further, although the shape of the openings disposed at the periphery of the linear opening is made as a square configuration with 5 μm side, the shape is not restricted only to the square configuration so long as the surface area is 25 μm² or less.

Furthermore, although the above-embodiment shows a case in which the device is not formed below the insulation film, similar effects can also be obtained if the device is formed therebelow.

Figure 10:
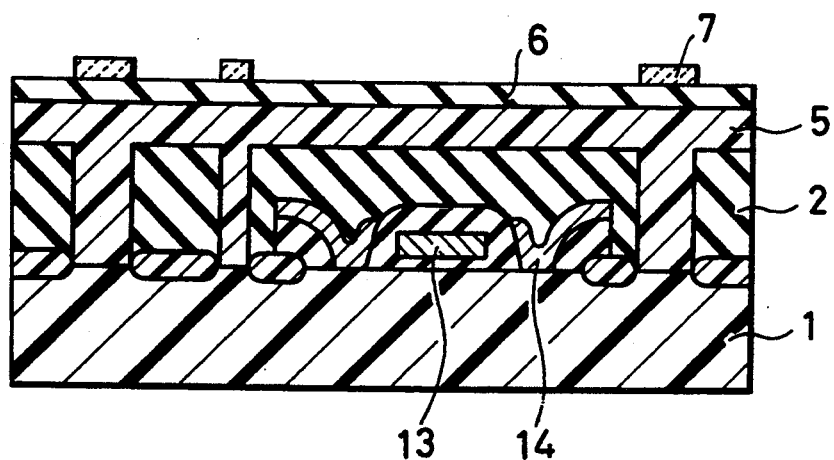
FIG. 10 is a schematic cross sectional view before the irradiation of energy-rays in another embodiment according to the present invention.

FIG. 10 is a schematic cross sectional view illustrating such a structure as another embodiment.

In the figure, a device constituted with a gate electrode 13, wirings 14, etc. is formed on the silicon substrate 1 and covered with the oxide film 2, over which the polycrystalline silicon 5 and, further, the oxide film 6 are formed. The method of laser beam irradiation, etc. are the same as those in the foregoing embodiment.

As has been described above according to the present invention, since openings each with the opening area of 25 μm² or less are formed along the linear opening spaced apart by 10 μm therefrom, the single-crystallized semiconductor layer after the scanning of the heat energy can be obtained on the insulation material with less unevenness for the film thickness and in a stabilized state.

What is claimed is:

1. A method of manufacturing a multi-layered semiconductor substrate comprising:
    a step of preparing a semiconductor substrate composed of single crystals and having a main surface,
    a step of forming a first insulation film on said main surface of said semiconductor substrate,
    a step of forming a first linear opening of a predetermined size reaching said semiconductor substrate at a predetermined position of said first insulation film,
    a step of forming second openings along said first opening to said first insulation film at a position spaced apart at least by 10 μm from the outer edge of said first opening, each of said second openings having an area of 25 μm² or less and reaching said semiconductor substrate,
    a step of forming a semiconductor layer composed of non-single crystals on said first insulation film also including the inside of said first and second openings,
    a step of forming a second insulation film on said semiconductor layer,
    a step of supplying heat energy to said semiconductor layer by scanning in a direction from said first opening toward said second openings, and melting said semiconductor layer with said heat energy thereby single crystallizing said semiconductor layer, and
    a step of removing said second insulation film.

2. A method of manufacturing a multi-layered semiconductor substrate as defined in claim 1, further including a step of forming a first nitride film corresponding to the size of said first and second openings on said second insulation film above said first and second openings, and a step of forming a stripe-like second nitride film along the scanning direction of said heat energy on said second insulation film above said first insulation film.

3. A method of manufacturing a multi-layered semiconductor substrate as defined in claim 1, wherein the semiconductor substrate is a silicon substrate, the semiconductor layer comprises polycrystalline silicon and the first and the second insulation films comprise silicon dioxide.

4. A method of manufacturing a multi-layered semiconductor substrate as defined in claim 1 wherein the heat energy is generated by the irradiation of energy-rays.

5. A method of manufacturing a multi-layered semiconductor substrate as defined in claim 4, wherein the energy-ray is continuously oscillated argon laser beams.

6. A method of manufacturing a multi-layered semiconductor substrate as defined in claim 1, wherein the first opening has a length greater than 5 $\mu$m in the direction orthogonal to the scanning direction of the heat energy, that is, the crystal growth direction.

7. A method of manufacturing a multi-layered semiconductor substrate as defined in claim 1, wherein the second opening is formed along only one side of the first linear opening.

8. A method of manufacturing a multi-layered semiconductor substrate as defined in claim 1, wherein the second opening is formed as a square shape not exceeding a 5 $\mu$m side.

9. A method of manufacturing a multi-layered semiconductor substrate as defined in claim 1, wherein a device is formed below the first insulation film.

* * * * *